(12) United States Patent
Lai

(10) Patent No.: US 7,664,979 B2
(45) Date of Patent: Feb. 16, 2010

(54) METHOD FOR ADJUSTING MONITOR CLOCK PHASE THAT SELECTS SCALER THRESHOLD VOLTAGE CORRESPONDING TO PERIOD HAVING REFERENCE NUMBER OF PULSES

(75) Inventor: Wan-Chin Lai, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 580 days.

(21) Appl. No.: 11/645,399

(22) Filed: Dec. 26, 2006

(65) Prior Publication Data

US 2007/0146027 A1 Jun. 28, 2007

(30) Foreign Application Priority Data

Dec. 23, 2005 (TW) ............... 94146341 A

(51) Int. Cl.
 *G06F 1/04* (2006.01)
(52) U.S. Cl. .................. 713/503; 345/204; 348/537
(58) Field of Classification Search .............. 345/204; 348/537; 713/500, 503
See application file for complete search history.

(56) References Cited

U.S. PATENT DOCUMENTS

| 5,561,692 | A | | 10/1996 | Maitland et al. |
| 5,936,678 | A | * | 8/1999 | Hirashima ............... 348/537 |
| 6,597,370 | B1 | * | 7/2003 | Lee ............................ 345/660 |
| 2007/0200840 | A1 | * | 8/2007 | Clynes et al. ............. 345/204 |

* cited by examiner

Primary Examiner—Albert Wang
(74) Attorney, Agent, or Firm—Wei Te Chung

(57) ABSTRACT

An exemplary method for adjusting clock phase of a monitor includes: setting a reference threshold voltage, when an input voltage of image signals is greater than the reference threshold voltage, a scaler begins to receive clock phases generated by a Phase Locked Loop; dividing the clock phase into a plurality of equal periods, recording a corresponding input voltage at each point dividing two adjacent period, and setting the corresponding input voltage as a threshold voltage of the next period; recording a quantity of the clock pulses in each period; evaluating whether a period of the clock phase is a regular period according to whether the quantity of clock pulse in the period is equal to a reference quantity or not, while the input voltage is generating retardation; and selecting the input voltage of the image signals corresponding to a regular period as a threshold voltage of the scaler.

7 Claims, 2 Drawing Sheets

METHOD FOR ADJUSTING MONITOR CLOCK PHASE THAT SELECTS SCALER THRESHOLD VOLTAGE CORRESPONDING TO PERIOD HAVING REFERENCE NUMBER OF PULSES

FIELD OF THE INVENTION

The present invention relates to a method for adjusting clock phase of a monitor, such as a liquid crystal display monitor.

BACKGROUND

In operation of a typical monitor, image signals are first sampled and scaled, the processed image signals are received by a display card of the monitor, and the display card controls voltages in a display panel of the monitor accordingly so that images can be displayed on a screen of the monitor. Nowadays, liquid crystal display monitors are widely used, and these monitors can display digital image signals. Liquid crystal display monitors can be divided into various categories of products according to their display (screen) resolution. For example, an SVGA (super video graphics array) monitor has a display resolution of 800×600 pixels, an XGA (extended graphics array) monitor has a display resolution of 1024×768 pixels, and an SXGA (super extended graphics array) monitor has a display resolution of 1028×1024 pixels.

Referring to FIG. 2, a conventional monitor 10 includes a microcomputer 11, a Phase Locked Loop (PLL) 12, an A/D (analog/digital) converter 13, and a scaler 14. The microcomputer 11 is provided for determining an image display mode according to a frequency of a horizontal synchronization (H-sync) signal and a vertical synchronization (V-sync) signal, and outputting a control signal to perform a signal processing operation according to the image display mode. The PLL 12 is provided for generating a clock phase based on the control signal output from the microcomputer 11. The A/D converter 13 is provided for sampling analog image signals to digital signals according to the clock phase provided by the PLL 12. For example, the A/D converter 13 may sample R/G/B (Red/Green/Blue) image signals transmitted from a signal source. The scaler 14 is provided for adjusting a size of the digital R/G/B signals output from the A/D converter 13 to a plurality of continuous frame units, in response to the control signal of the microcomputer 11 and by using the clock phase provided by the PLL 12. Each frame unit can be represented as a scan waveform, i.e., a clock phase having a plurality of clock pulses. The scaler 14 is also provided for outputting the adjusted digital R/G/B signals to driving circuitry (not shown) of the monitor.

Referring to FIG. 3, graph (A) shows a waveform diagram illustrating ideal operation of an input voltage of the image signals received by the scaler 14; and graph (B) shows a waveform diagram illustrating the clock phase generated by the PLL 12. The input voltage of the image signals is 0.7 volts, and an initial threshold voltage of the scaler 14 is also set at 0.7 volts. That is, when the input voltage of the image signals is greater than or equal to 0.7 volts, the scaler 14 begins to receive the clock phase provided by the PLL 12. In graph (B), the image signal is an H-sync signal that corresponds to a display resolution of 1024×768 pixels (i.e., the monitor 10 is an XGA monitor). Accordingly, a corresponding clock phase generated by the PLL 12 includes 1024 clock pulses.

However, in general, the input voltage of the image signals generates retardation. Even though the scaler 14 is set with a lower threshold voltage in order to reduce retardation, retardation in general cannot be completely avoided. Referring to FIG. 4, graph (A) shows an actual waveform diagram illustrating operation of an input voltage of the image signals received by the scaler 14; graph (B) shows an actual waveform diagram illustrating the clock phase generated by the PLL 12 according to an input voltage of 'b'; and graph (C) shows another actual waveform diagram illustrating the clock phase generated by the PLL 12 according to an input voltage of 'c'.

When the input voltage is greater than or equal to the threshold voltage, the scaler 14 begins to receive the clock phase provided by the PLL 12. As a result, when the input voltage is set at 'b', the clock phase includes 1025 clock pulses; and when the input voltage is set at 'c', the clock phase includes 1024 clock pulses. Therefore if the threshold voltage is improperly set, the quantity of the clock pulses varies when the input voltage generates retardation. This in turn is liable to impair the stability of the monitor and its display performance.

It is desired to provide a method for adjusting clock phase of a monitor that can overcome the above-described deficiencies.

SUMMARY

An exemplary method for adjusting clock phase of a monitor, includes: setting a reference threshold voltage, when an input voltage of image signals is greater than or equal to the reference threshold voltage, a scaler of the monitor begins to receive a clock phase generated by a Phase Locked Loop of the monitor; dividing the clock phase into a plurality of equal periods, recording a corresponding input voltage at each point dividing two adjacent period, and setting the corresponding input voltage as a threshold voltage of the next period; recording a quantity of clock pulses of the clock phases in each of the periods; evaluating whether a period of the clock phase is a regular period according to whether the quantity of clock pulses in each period is equal to a reference quantity or not while the input voltage is generating retardation; and selecting the input voltage of the image signals corresponding to a regular period as a threshold voltage of the scaler.

Advantages and novel features of the method will become more apparent from the following detailed description when taken in conjunction with the accompanying drawings, in which:

DETAILED DESCRIPTION OF PREFERRED EMBODIMENTS

Reference will now be made to the drawings to describe preferred and exemplary embodiments of the present invention in detail.

Figure 1:
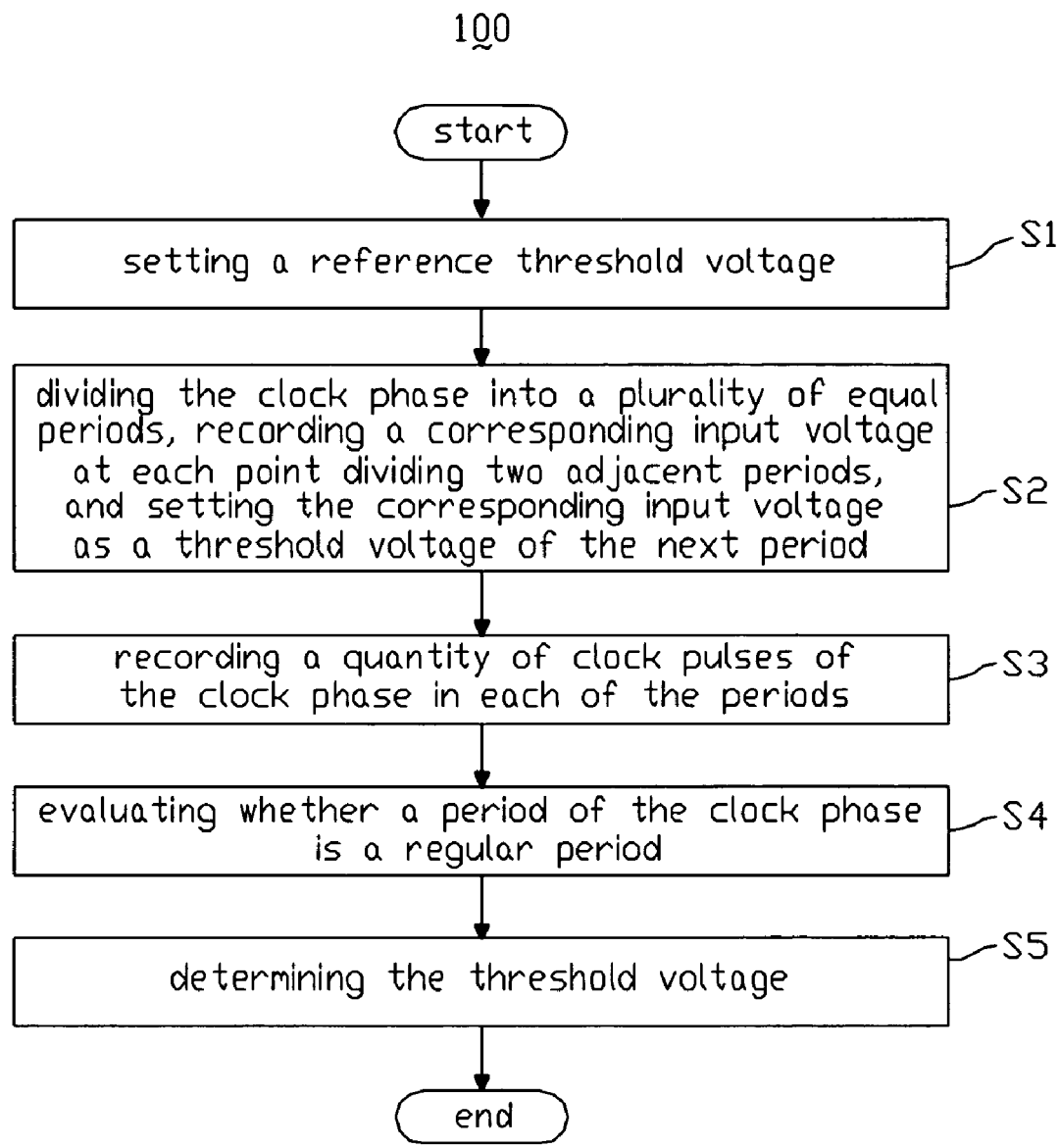
FIG. 1 is a flow chart of a method for adjusting clock phase of a monitor according to an exemplary embodiment of the present invention.
Figure 2:
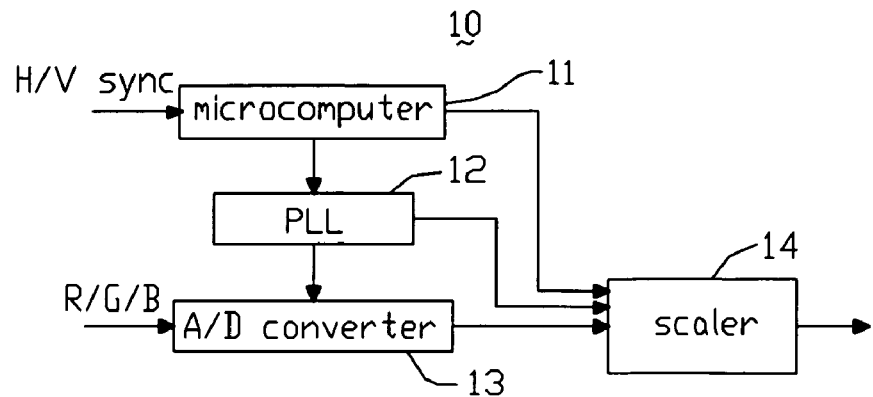
FIG. 2 is a block diagram of certain components of a conventional monitor.
Figure 3:
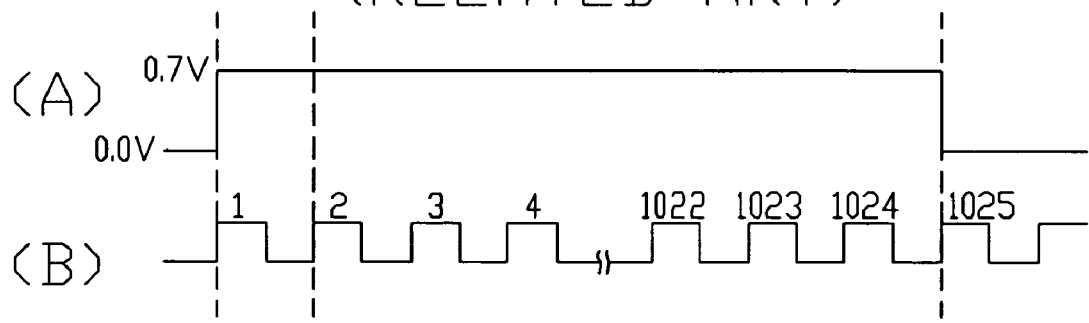
FIG. 3 shows waveform diagrams illustrating ideal operation of the monitor of FIG. 2.
Figure 4:
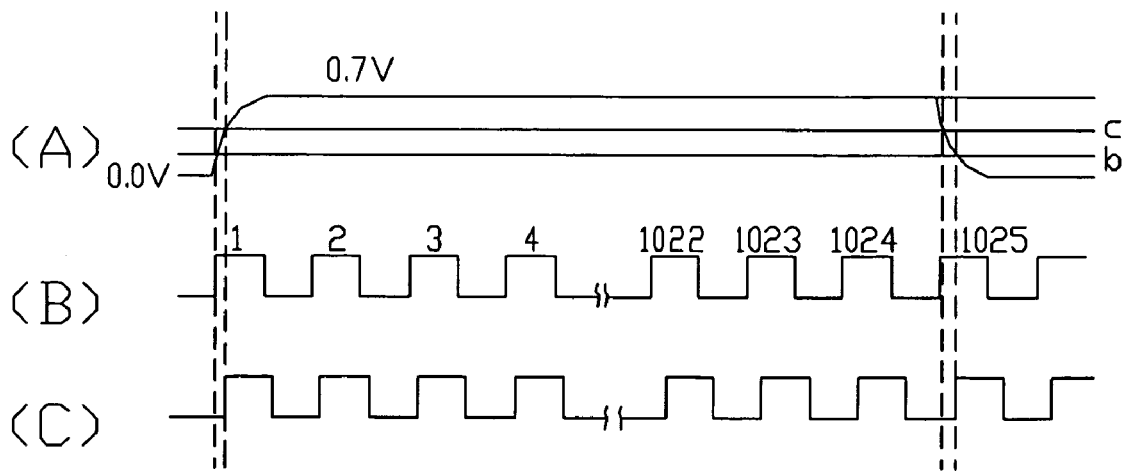
FIG. 4 shows waveform diagrams illustrating actual operation of the monitor of FIG. 2.

Referring to FIG. 1, a flow chart of a method for adjusting clock phase of a monitor according to an exemplary embodiment of the present invention is shown. The method 100 includes the following steps:

Firstly, setting a reference threshold voltage, as shown in step S1. The reference threshold voltage may be much less than 0.7 volts. When an input voltage of image signals is greater than or equal to the reference threshold voltage, a scaler of the monitor begins to receive image signals provided by an A/D converter of the monitor, and receive a clock phase generated by a Phase Locked Loop (PLL) of the monitor.

Secondly, dividing the clock phase into a plurality of equal periods, as shown in step S2. In the exemplary embodiment, the image signal is an H-sync signal that corresponds to a display resolution of 1024×768 pixels (i.e., the monitor is an XGA monitor). Accordingly, a corresponding clock phase generated by the PLL includes 1024 clock pulses. In the exemplary embodiment, the clock phase is divided into 64 equal periods. A corresponding input voltage at each point dividing two adjacent periods is recorded, and each such corresponding input voltage is then set as a threshold voltage of the next period.

Thirdly, recording a quantity of clock pulses of the clock phase in each of the periods, as shown in step S3.

Fourthly, evaluating whether a period of the clock phase is a regular period, as shown in step S4. Each period is evaluated according to whether the quantity of clock pulses in the period is equal to a certain reference quantity or not while the input voltage is generating retardation. In the exemplary embodiment, because the clock phase includes 1024 clock pulses, and the clock phase is divided into 64 equal periods, then the reference quantity is 16.

Finally, determining the threshold voltage, as shown in step S5. The input voltage of the image signals corresponding to a regular period is selected as a threshold voltage of the scaler.

According to this method, a threshold voltage of a scaler of the monitor is determined in a way that ensures the clock pulses of the clock phase generated by the PLL maintains a constant quantity even when the input voltage of the image signals generated by the A/D converter generates retardation. Therefore, the monitor has good stability.

It is to be further understood that even though numerous characteristics and advantages of preferred and exemplary embodiments have been set out in the foregoing description, together with details of structures and functions associated with the embodiments, the disclosure is illustrative only, and changes may be made in detail (including in matters of shape, size, and arrangement of parts) within the principles of the invention to the full extent indicated by the broad general meaning of the terms in which the appended claims are expressed.

What is claimed is:

1. A method for adjusting clock phase of a monitor, comprising:
setting a reference threshold voltage, wherein when an input voltage of image signals is greater than or equal to the reference threshold voltage, a scaler of the monitor begins to receive a clock phase generated by a Phase Locked Loop of the monitor;
dividing the clock phase into a plurality of equal periods, recording a corresponding input voltage at each point dividing two adjacent periods, and setting the corresponding input voltage as a threshold voltage of the next period;
recording a quantity of clock pulses of the clock phase in each of the periods;
evaluating whether a period of the clock phase is a regular period according to whether the quantity of clock pulses in each period is equal to a reference quantity or not while the input voltage is generating retardation; and
selecting the input voltage of the image signals corresponding to a regular period as a threshold voltage of the scaler.

2. The method as claimed in claim 1, wherein the image signals are horizontal synchronization digital image signals.

3. The method as claimed in claim 2, wherein the horizontal synchronization digital image signals are R/G/B (Red/Green/Blue) signals.

4. The method as claimed in claim 1, wherein the R/G/B signals correspond to a display resolution of 1024×768 pixels.

5. The method as claimed in claim 4, wherein the clock phase is divided into 64 equal periods.

6. A method for adjusting clock phase of a monitor, comprising:
setting a reference threshold voltage, wherein when an input voltage of image signals is different from the reference threshold voltage, a scaler of the monitor begins to receive a clock phase generated by a Phase Locked Loop of the monitor;
dividing the clock phase into a plurality of equal periods, recording a corresponding input voltage at each point dividing two adjacent periods, and setting the corresponding input voltage as a threshold voltage of the next period;
recording a quantity of clock pulses of the clock phase in each of the periods;
evaluating whether a period of the clock phase is a regular period according to whether the quantity of clock pulses in each period is equal to a reference quantity or not while the input voltage is generating retardation; and
selecting the input voltage of the image signals corresponding to a regular period as a threshold voltage of the scaler.

7. A method for adjusting clock phase of a monitor, comprising:
setting a reference threshold voltage, wherein when an input voltage of image signals is greater than or equal to the reference threshold voltage, a scaler of the monitor begins to receive a clock phase generated by a Phase Locked Loop of the monitor;
dividing the clock phase into a plurality of equal periods, recording a corresponding input voltage at each point dividing two adjacent periods, and setting the corresponding input voltage as a threshold voltage of the next period;
recording a quantity of clock pulses of the clock phase in each of the periods;
evaluating whether a period of the clock phase is a regular period according to whether the quantity of clock pulses in each period is equal to a reference quantity or not; and
selecting the input voltage of the image signals corresponding to a regular period as a threshold voltage of the scaler.

* * * * *

UNITED STATES PATENT AND TRADEMARK OFFICE
CERTIFICATE OF CORRECTION

PATENT NO. : 7,664,979 B2  Page 1 of 1
APPLICATION NO. : 11/645399
DATED : February 16, 2010
INVENTOR(S) : Wan-Chin Lai It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 632 days.

Signed and Sealed this

Seventh Day of December, 2010

David J. Kappos
*Director of the United States Patent and Trademark Office*